United States Patent
Yu et al.

(10) Patent No.: US 9,236,312 B2
(45) Date of Patent: Jan. 12, 2016

(54) PREVENTING EPI DAMAGE FOR CAP NITRIDE STRIP SCHEME IN A FIN-SHAPED FIELD EFFECT TRANSISTOR (FINFET) DEVICE

(71) Applicant: GLOBALFOUNDRIES Inc., Grand Cayman (KY)

(72) Inventors: Hong Yu, Rexford, NY (US); Hyucksoo Yang, Saratoga Springs, NY (US); Richard J. Carter, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 10 days.

(21) Appl. No.: 14/053,088

(22) Filed: Oct. 14, 2013

(65) Prior Publication Data

US 2015/0102414 A1    Apr. 16, 2015

(51) Int. Cl.
| | |
|---|---|
| H01L 29/78 | (2006.01) |
| H01L 21/336 | (2006.01) |
| H01L 21/28 | (2006.01) |
| H01L 27/092 | (2006.01) |
| H01L 27/12 | (2006.01) |
| H01L 21/84 | (2006.01) |
| H01L 21/8238 | (2006.01) |
| H01L 29/66 | (2006.01) |
| H01L 21/762 | (2006.01) |
| H01L 27/088 | (2006.01) |

(52) U.S. Cl.
CPC .. H01L 21/823821 (2013.01); H01L 21/76224 (2013.01); H01L 27/0886 (2013.01); H01L 27/0924 (2013.01); H01L 29/66795 (2013.01)

(58) Field of Classification Search
CPC ............ H01L 29/785; H01L 29/66795; H01L 29/045; H01L 29/7853; H01L 21/823821; H01L 21/845; H01L 27/0924; H01L 27/1211; H01L 21/823431; H01L 27/0886; H01L 29/7834; H01L 2029/7858; H01L 29/41791; H01L 21/02433; H01L 21/26586
USPC ................................. 257/250–260, 365–375
See application file for complete search history.

(56) References Cited

U.S. PATENT DOCUMENTS

| | | | |
|---|---|---|---|
| 3,356,858 A * | 12/1967 | Wanlass ......................... 326/103 |
| 8,084,309 B2 * | 12/2011 | Cheng ..................... H01L 21/84 257/351 |
| 8,586,486 B2 | 11/2013 | Chen et al. |
| 2003/0022500 A1 | 1/2003 | Tang |
| 2005/0153500 A1 | 7/2005 | Jeong |
| 2011/0278676 A1 * | 11/2011 | Cheng et al. ................... 257/369 |
| 2012/0104498 A1 * | 5/2012 | Majumdar ........ H01L 29/66545 257/351 |
| 2013/0119455 A1 * | 5/2013 | Chen et al. ...................... 257/324 |
| 2013/0196495 A1 * | 8/2013 | Flachowsky ........ H01L 29/6653 438/585 |
| 2014/0131776 A1 * | 5/2014 | Ching et al. ................... 257/288 |

* cited by examiner

*Primary Examiner* — Howard Weiss
*Assistant Examiner* — Nelson Garces
(74) *Attorney, Agent, or Firm* — Williams Morgan, P.C.

(57) ABSTRACT

Approaches for forming an oxide cap to protect a semiconductor device (e.g., a fin field effect transistor device (FinFET)) are provided. Specifically, approaches are provided for forming an oxide cap over a subset (e.g., SiP regions) of raised source drain (RSD) structures on the set of fins of the FinFET device to mitigate damage during subsequent processing. The oxide spacer is deposited before the removal of a nitride capping layer from the FinFET device (e.g., by a hot phosphorus wash). The oxide cap on top of the RSD structures will be preserved throughout the removal of the nitride capping layer to provide hardmask protection during this process.

17 Claims, 7 Drawing Sheets

PREVENTING EPI DAMAGE FOR CAP NITRIDE STRIP SCHEME IN A FIN-SHAPED FIELD EFFECT TRANSISTOR (FINFET) DEVICE

BACKGROUND

1. Technical Field

This invention relates generally to the field of semiconductors, and more particularly, to forming a nitride spacer to protect a FinFET device.

2. Related Art

A typical integrated circuit (IC) chip includes a stack of several levels or sequentially formed layers of shapes. Each layer is stacked or overlaid on a prior layer and patterned to form the shapes that define devices (e.g., field effect transistors (FETs)) and connect the devices into circuits. In a typical state of the art complementary insulated gate FET process, such as what is normally referred to as CMOS, layers are formed on a wafer to form the devices on a surface of the wafer. Further, the surface may be the surface of a silicon layer on a silicon on insulator (SOI) wafer. A simple FET is formed by the intersection of two shapes, a gate layer rectangle on a silicon island formed from the silicon surface layer. Each of these layers of shapes, also known as mask levels or layers, may be created or printed optically through well-known photolithographic masking, developing, and level definition (e.g., etching, implanting, deposition, etc.).

The FinFET is a transistor design that attempts to overcome the issues of short-channel effect encountered by deep submicron transistors, such as drain-induced barrier lowering (DIBL). Such effects make it harder for the voltage on a gate electrode to deplete the channel underneath and stop the flow of carriers through the channel—in other words, to turn the transistor off. By raising the channel above the surface of the wafer instead of creating the channel just below the surface, it is possible to wrap the gate around all but one of its sides, providing much greater electrostatic control over the carriers within it.

While FinFET technology can provide superior levels of scalability, new challenges can arise in designing and/or fabricating these devices. For example, processes used to remove materials during the fabrication process can have unintended effects on other components of the device. These effects can be exacerbated by the unique shapes that these components may assume in the FinFET model.

SUMMARY

In general, approaches for forming an oxide cap to protect a semiconductor device (e.g., a fin field effect transistor device (FinFET)) are provided. Specifically, approaches are provided for forming an oxide cap over a subset (e.g., SiP regions) of raised source drain (RSD) structures on the set of fins of the FinFET device to mitigate damage during subsequent processing. The oxide spacer is deposited before the removal of a nitride capping layer from the FinFET device (e.g., by a hot phosphorus wash). The oxide cap on top of the RSD structures will be preserved throughout the removal of the nitride capping layer to provide hardmask protection during this process.

One aspect of the present invention includes a method for forming a device, the method comprising: forming a set of gate structures over a finned substrate, each of the set of gate structures comprising a nitride capping layer; forming a set of raised source drain (RSD) structures on the finned substrate; forming an oxide cap over a subset of the RSD structures; and removing the nitride capping layer.

Another aspect of the present invention includes a method for forming an oxide cap to protect a fin-shaped field effect transistor (FinFET) device, the method comprising: forming a set of gate structures over a finned substrate, each of the set of gate structures comprising a nitride capping layer; forming a set of raised source drain (RSD) structures on the finned substrate; forming a silicate over a subset of the RSD structures; oxidizing the silicate to form the oxide cap; and removing the nitride capping layer.

Yet another aspect of the present invention includes a fin-shaped field effect transistor (FinFET) device, formed via a process, comprising: forming a set of fins from a substrate to get a finned substrate; forming a set of gate structures over the finned substrate, each of the set of gate structures comprising a nitride capping layer; growing a set of epitaxial phosphorus-doped Si (SiP) regions over a subset of the set of gate structures; growing a silicate on the SiP regions; oxidizing the silicate using a plasma oxidation process to form an oxide cap; removing the nitride capping layer via a hot phosphorus rinse, wherein the oxide cap prevents damage to the SiP regions from the hot phosphorus rinse; and removing the oxide cap from the SiP regions.

BRIEF DESCRIPTION OF THE DRAWINGS

These and other features of this invention will be more readily understood from the following detailed description of the various aspects of the invention taken in conjunction with the accompanying drawings in which.

Figure 1:
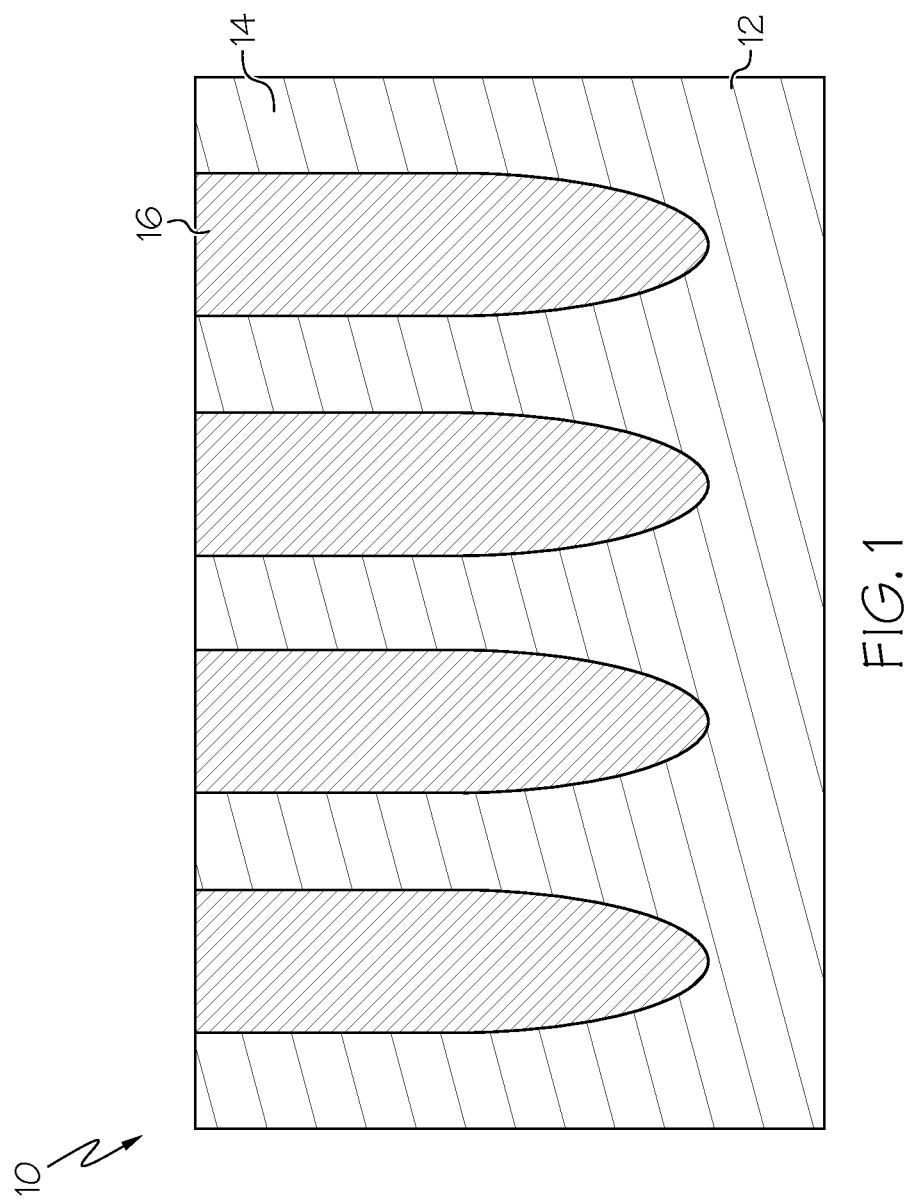
FIG. 1 shows a FinFET semiconductor device according to an embodiment of the present invention.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION

Exemplary embodiments will now be described more fully herein with reference to the accompanying drawings, in which exemplary embodiments are shown. It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art.

As mentioned above, disclosed herein are approaches for forming an oxide cap to protect a semiconductor device (e.g., a fin field effect transistor device (FinFET)). Specifically, approaches are provided for forming an oxide cap over a subset (e.g., SiP regions) of raised source drain (RSD) structures on the set of fins of the FinFET device to mitigate damage during subsequent processing. The oxide spacer is deposited before the removal of a nitride capping layer from the FinFET device (e.g., by a hot phosphorus wash). The oxide cap on top of the RSD structures will be preserved throughout the removal of the nitride capping layer to provide hardmask protection during this process.

The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

As used herein, "depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 2:
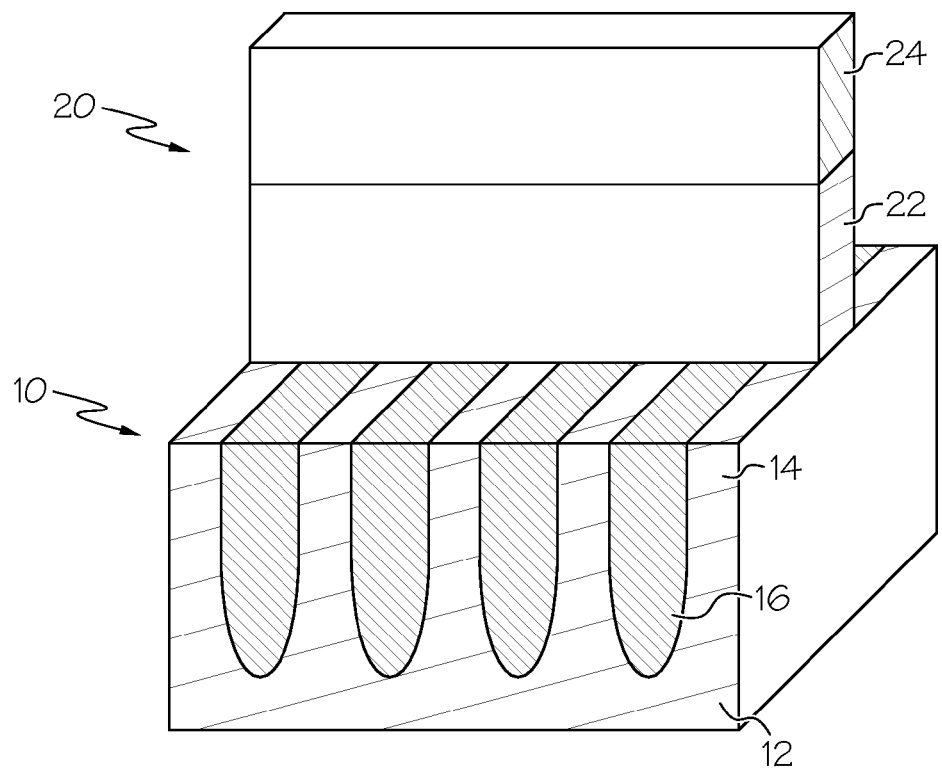
FIG. 2 shows a "dummy" gate formation according to an embodiment of the present invention.
Figure 3:
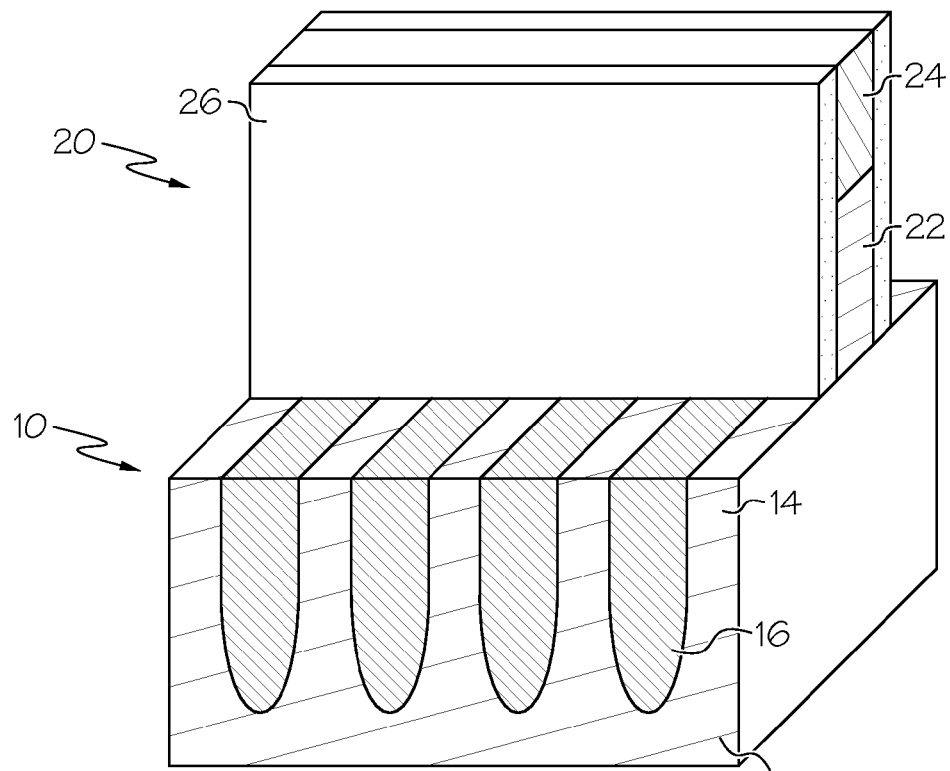
FIG. 3 shows a spacer formation according to an embodiment of the present invention.

Referring now to FIG. 1, an initial formation stage of a semiconductor device 10 is shown. As depicted, the device 10 can be formed on a substrate 12 by forming a set of fins 14 from the substrate. To this extent, device 10 generally comprises a uniform, oxide-fin surface having a fin region 14 and an oxide fill 16. In general, the oxide-fin surface is formed by polishing (e.g., via CMP) oxide fill 16 to a top surface of fin region 14. This results in a substantially "planar" or "uniform" surface. In FIG. 2, a dummy gate 20 formation process is commenced. Specifically, a gate material 22 and a hard mask layer 24 are positioned on the surface (collectively referred to as a gate structure or "dummy" gate 20). In FIG. 3, a set of spacers 26 are added to opposing sides of the gate structure.

The term "substrate" 12 as used herein is intended to include a semiconductor substrate, a semiconductor epitaxial layer deposited or otherwise formed on a semiconductor substrate and/or any other type of semiconductor body, and all such structures are contemplated as falling within the scope of the present invention. For example, the semiconductor substrate 12 may comprise a semiconductor wafer (e.g., silicon, SiGe, or an SOI wafer) or one or more die on a wafer, and any epitaxial layers or other type semiconductor layers formed thereover or associated therewith. A portion or entire semiconductor substrate 12 may be amorphous, polycrystalline, or single-crystalline. In addition to the aforementioned types of semiconductor substrates, the semiconductor substrate 12 employed in the present invention may also comprise a hybrid oriented (HOT) semiconductor substrate in which the HOT substrate has surface regions of different crystallographic orientation. The semiconductor substrate 12 may be doped, undoped or contain doped regions and undoped regions therein. The semiconductor substrate 12 may contain regions with strain and regions without strain therein, or contain regions of tensile strain and compressive strain.

Gate structures 20 may be fabricated using any suitable process including one or more photolithography and etch processes. The photolithography process may include forming a photoresist layer (not shown) overlying substrate 12 (e.g., on a silicon layer), exposing the resist to a pattern, performing post-exposure bake processes, and developing the resist to form a masking element including the resist. The masking element may then be used to etch each gate 20 into the silicon layer, e.g., using reactive ion etch (RIE) and/or other suitable processes.

In one embodiment, gate structures 20 are formed by a double-patterning lithography (DPL) process. DPL is a method of constructing a pattern on a substrate by dividing the pattern into two interleaved patterns. DPL allows enhanced feature (e.g., fin) density. In this embodiment, gate structures 20 each include a gate electrode. Numerous other layers may also be present, for example, a gate dielectric layer, interface layers, and/or other suitable features. The gate dielectric layer may include dielectric material such as, silicon oxide, silicon nitride, silicon oxinitride, dielectric with a high dielectric constant (high k), and/or combinations thereof. Examples of high k materials include hafnium silicate, hafnium oxide, zirconium oxide, aluminum oxide, hafnium dioxide-alumina ($HfO_2$—$Al_2O_3$) alloy, and/or combinations thereof. The gate dielectric layer may be formed using processes such as, photolithography patterning, oxidation, deposition, etching, and/or other suitable processes. The gate electrode may include polysilicon, silicon-germanium, a metal including metal compounds such as, Mo, Cu, W, Ti, Ta, TiN, TaN, NiSi, CoSi, and/or other suitable conductive materials known in the art. The gate electrode may be formed using processes such as, physical vapor deposition (PVD), CVD, plasma-enhanced chemical vapor deposition (PECVD), atmospheric pressure chemical vapor deposition (APCVD), low-pressure CVD (LPCVD), high density plasma CVD (HD CVD), atomic layer CVD (ALCVD), and/or other suitable processes which may be followed, for example, by photolithography and/or etching processes.

Figure 4:
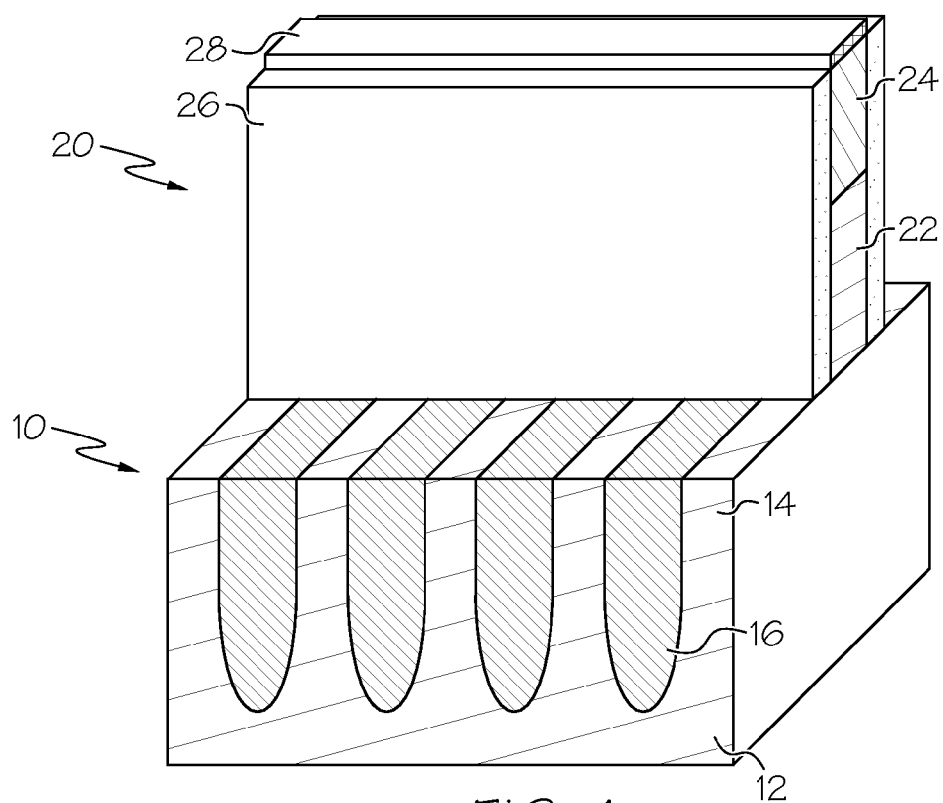
FIG. 4 shows a nitride cap formation according to an embodiment of the present invention.

Referring now to FIG. 4, device 10 further comprises a nitride cap (e.g., SiN) 28 formed over gate region 20. In one embodiment, nitride cap 28 can be formed from silicon by thermal or plasma conversion of silicon into nitride, i.e., by thermal nitridation or by plasma nitridation of silicon. Alternately, nitride cap 28 can be formed by deposition of silicon nitride, for example, by chemical vapor deposition (CVD), or by plasma oxidation.

Figure 5:
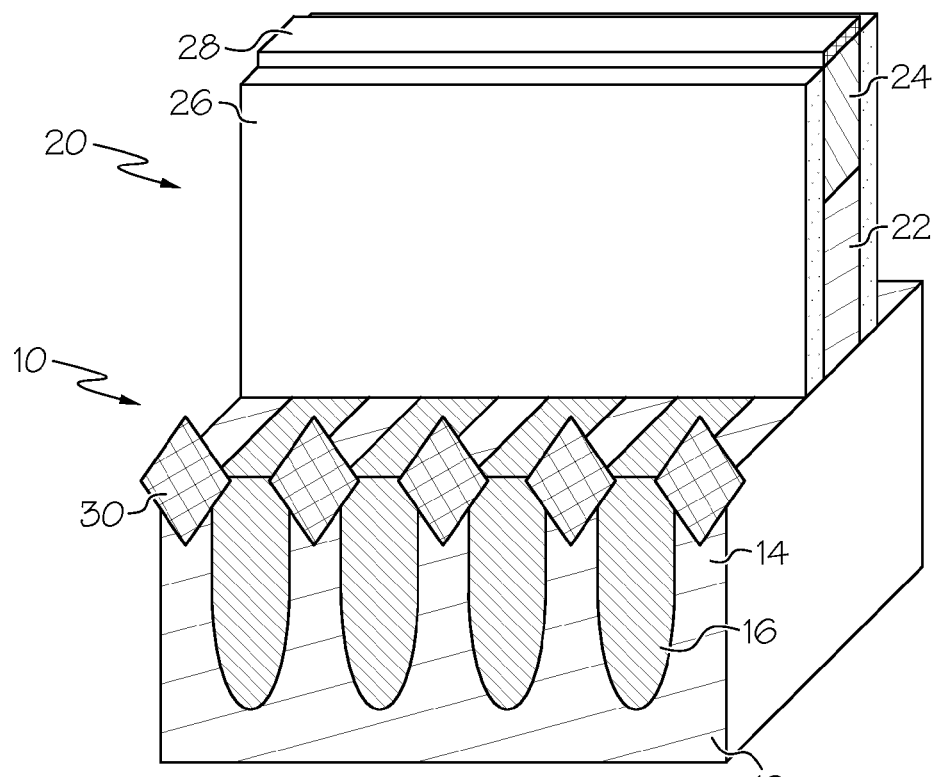
FIG. 5 shows a formation of raise source drain (RSD) structures according to an embodiment of the present invention.

Referring now to FIG. 5, a formation of raised source drain (RSD) structures 30 according to an embodiment of the present invention is shown. As illustrated, an RSD structure 30 can be formed on each fin 14 of FinFET device 10. RSD structure 30 can be grown as an epitaxial structure or can be formed in any way now known or later developed. Further, RSD structure 30 can be formed using any material now known nor later developed for use as a source and/or drain.

Figure 6:
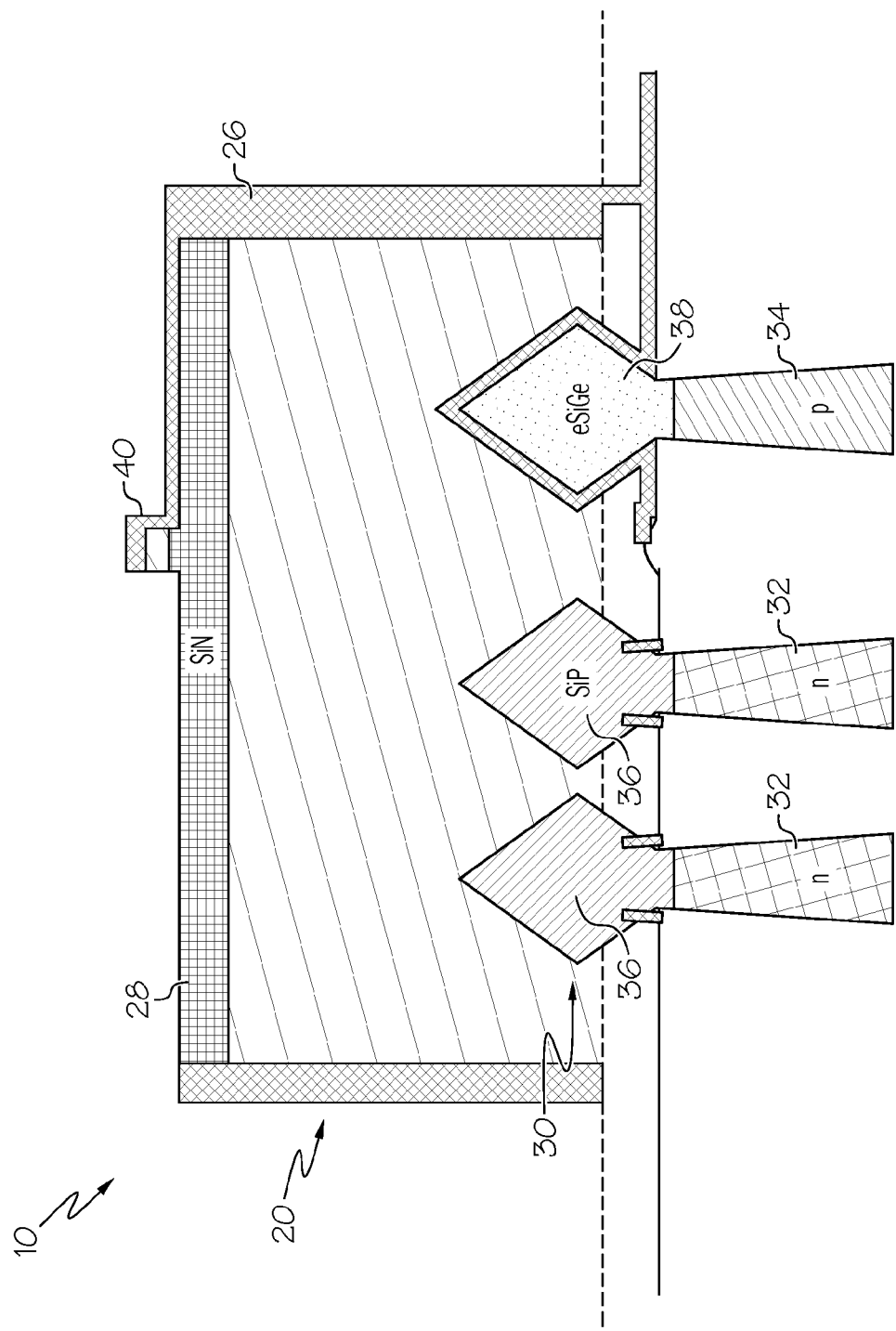
FIG. 6 shows RSD structures having SiP and SiGe regions according to an embodiment of the present invention.

Referring now to FIG. 6, FinFET device 10 having a set of RSD structures 30 is shown. As illustrated, a subset of the fins 14 have been formed into a set of NFET regions 32. Similarly, a subset of the fins 14 (e.g., a remainder of some or all fins that were not formed into the set of NFET regions 32) have been formed a set of PFET regions 34. A set of phosphorus-doped Si (SiP) regions 36 of RSD structures 30 has been formed in NFET regions 32. Similarly, a set of silicon germanium (SiGe) regions 38 of RSD structures 30 have been formed in PFET region 34.

It is often the case that, subsequent to the formation of RSD structures 30, nitride capping layer 28 must be removed. This removal is often accomplished with a hot phosphorus wash. However, the inventors of the present invention have discovered that current solutions for removing the nitride capping layer 28 have certain disadvantages. For example, as shown in FIG. 6, nitride capping layer 28 and/or spacers 26 may have certain irregularities, such as elevated region 40. Such irregularities can lead to portions of nitride capping layer 28 and/or spacers 26 being removed prior to other portions, leading to bleed-through of the substance (e.g., hot phosphorus wash) used to perform the removal. This bleed-through can cause damage to certain of RSD structures 30, in particular SiP regions.

Figure 7:
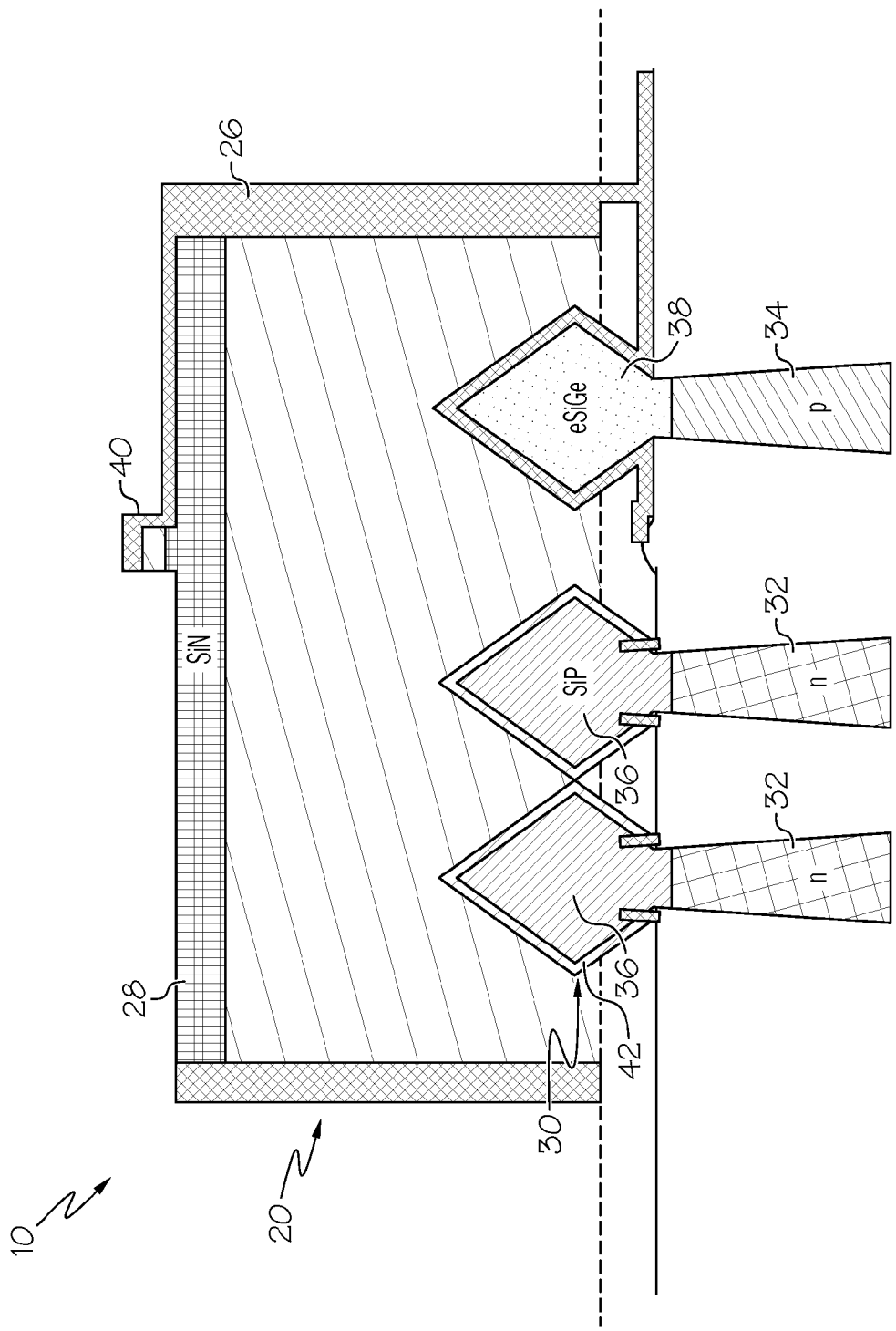
FIG. 7 shows a formation of a silicate on the SiP regions according to an embodiment of the present invention.
Figure 8:
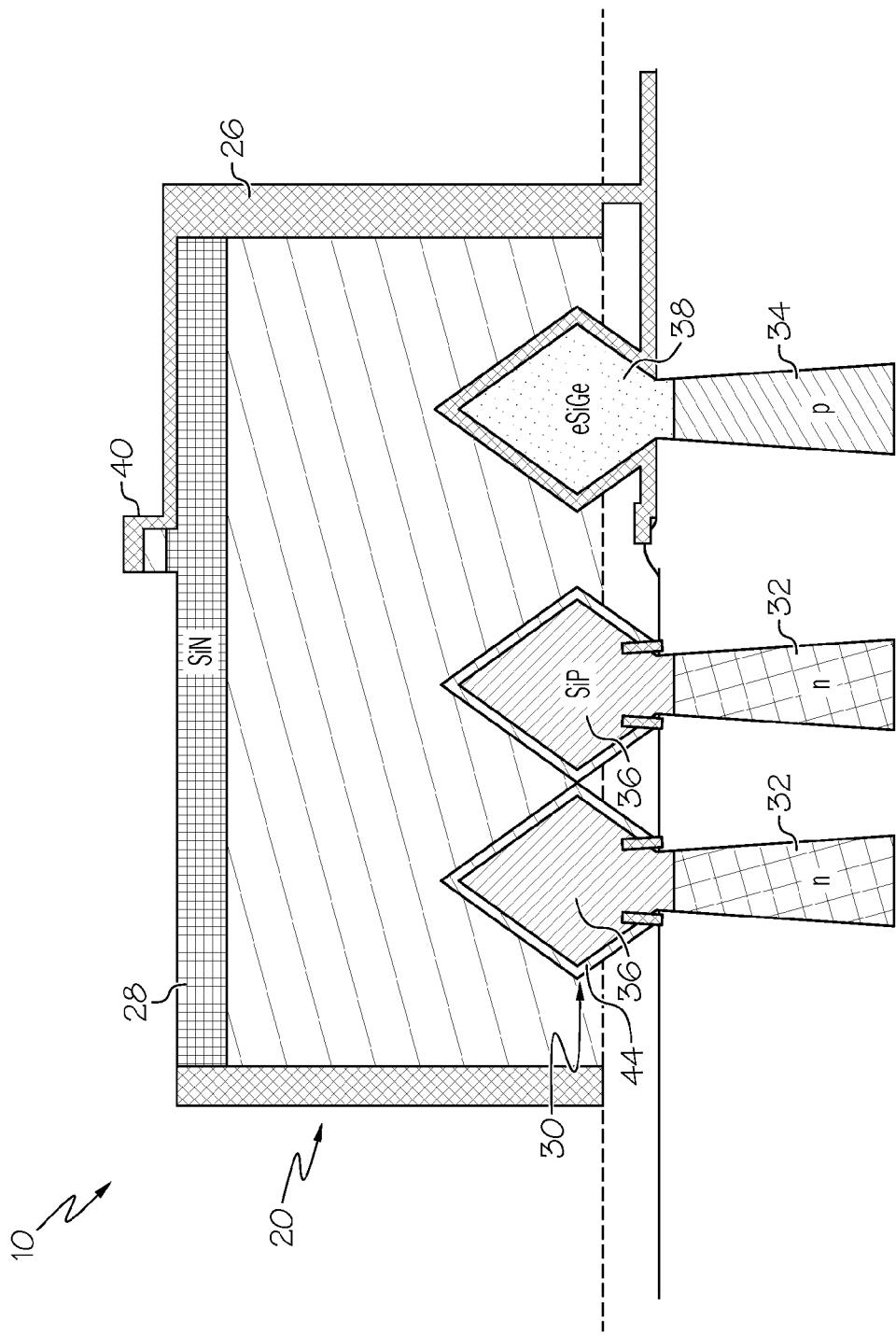
FIG. 8 shows an oxidizing of the silicate to form an oxide cap according to an embodiment of the present invention.

In order to reduce and/or substantially eliminate damage to the SiP regions 36 during the removal of the nitride capping layer 28, in the present invention, an oxide cap can be formed over a subset of RSD structures 30 (e.g., SiP regions 36). For example, as shown in FIG. 7, a silicate 42 can be grown on SiP regions 36, e.g., using an epitaxial method, or the like. Note that silicate 42 that is grown on SiP regions 36 is not present on SiGe regions 38 due to the fact that the SiGe regions 38 are covered with nitride capping layer 28. In any case, silicate 42 can be oxidized to form oxide cap 44. For example, this oxidizing can include a thermal oxidation process with conventional furnace oxide process, an in situ steam generation (ISSG) or other rapid thermal oxidation technique, a plasma oxidation process and/or any other process that is now known or later developed for oxidizing a Si deposition (e.g., converting silicon (S) to silicon oxide SiO2).

Figure 9:
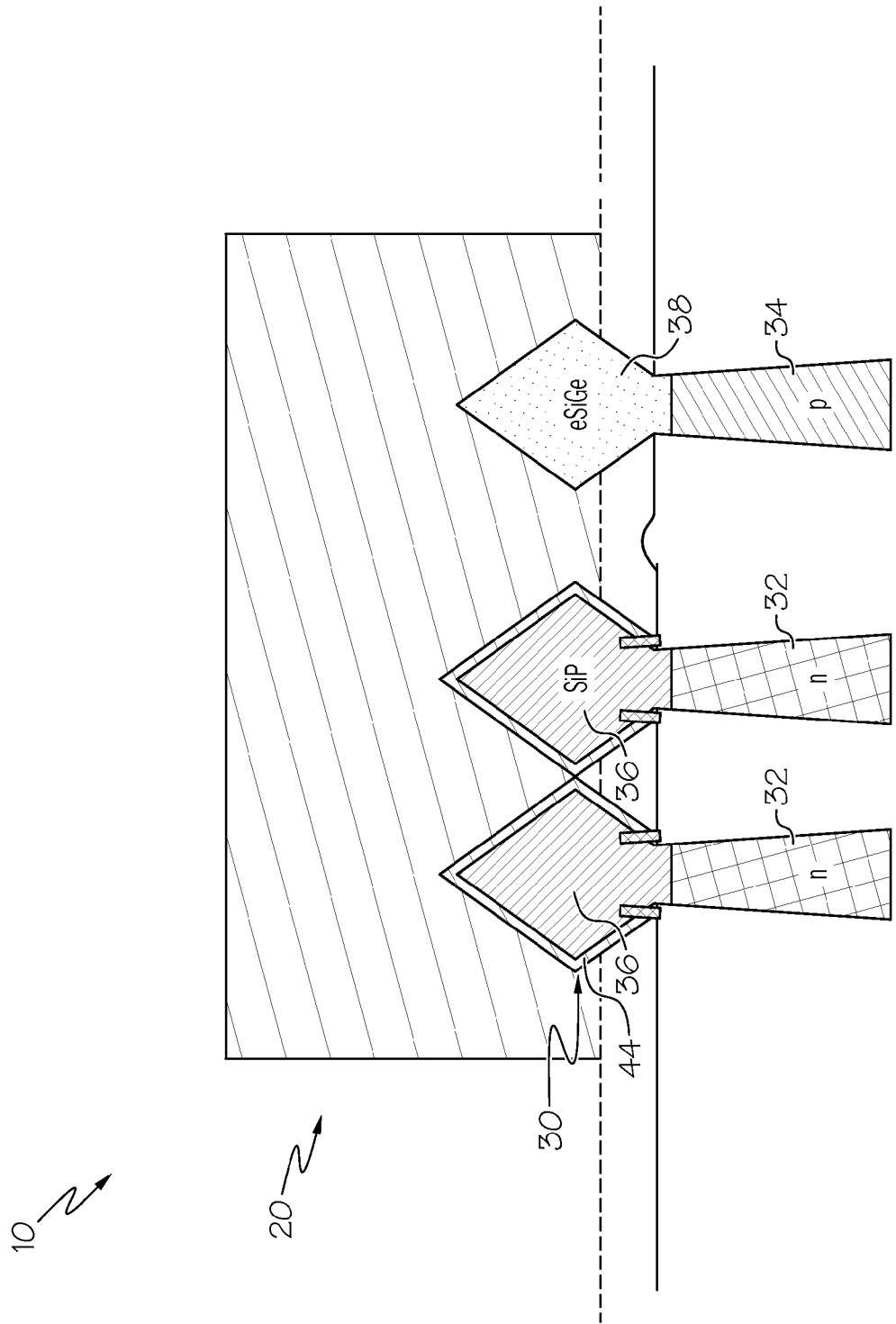
FIG. 9 shows a removal of a nitride capping layer according an embodiment of the present invention.

When, as shown in FIG. 9, nitride capping layer 28 and/or spacers 26 are removed (e.g., using a hot phosphorus wash), oxide cap 44 will protect the RSD structures 30 (e.g., SiP regions 36) upon which the oxide cap 44 was formed. Oxide cap 44 can then be removed from the RSD structures 30 and subsequent formation (e.g., of gates, contacts, etc.) can be resumed.

In various embodiments, design tools can be provided and configured to create the datasets used to pattern the semiconductor layers as described herein. For example data sets can be created to generate photomasks used during lithography operations to pattern the layers for structures as described herein, including a set of gate structures formed over a fined substrate, each of the set of gate structures comprising a nitride capping layer, RSD structures formed on the finned substrate, and an oxide cap formed over a subset of the RSD structures. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

It is apparent that there has been provided methods for forming an oxide cap to protect a FinFET device. While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for forming a device, the method comprising:
   forming a set of gate structures over a finned substrate, each of the set of gate structures comprising a nitride capping layer;
   forming a set of raised source drain (RSD) structures on the finned substrate, wherein a first subset of the RSD structures includes an NFET region and a second subset of the RSD structures includes a PFET region;
   forming an oxide cap over only the first subset of the of the RSD structures: and
   removing the nitride capping layer.

2. The method according to claim 1, further comprising:
forming a set of fins from the substrate to form the finned substrate; and
growing a RSD structure of the set on RSD structures on each fin of the set of fins.

3. The method according to claim 2, further comprising:
forming an NFET region from a subset of the set of fins; and
forming a PFET region from a remainder of the set of fins.

4. The method according to claim 3, further comprising:
forming a set of phosphorus-doped Si (SiP) regions of the RSD in the NFET region; and
forming a set of silicon germanium (SiGe) regions of the RSD in the PFET region.

5. A method for forming a device, the method comprising:
forming a set of fins from a substrate to form a finned substrate;
growing a set of RSD structures on each fin of the set of fins
forming a set of gate structures over the finned substrate, each of the set of gate structures comprising a nitride capping layer;
forming an NFET region from a subset of the set of fins;
forming a PFET region from a remainder of the set of fins;
forming a set of phosphorus-doped Si (SiP) regions in the NFET region; and
forming a set of silicon germanium (SiGe) regions in the PFET region;
forming an oxide cap only over the SiP regions;
removing the nitride capping layer.

6. The method according to claim 5, wherein forming the oxide cap comprises:
growing a silicate on the SiP regions; and
oxidizing the silicate using a plasma oxidation process.

7. The method according to claim 6,
wherein the silicate is grown on the SiP regions using an epitaxial process; and
wherein the plasma oxidation process includes a thermal oxidation process.

8. The method according to claim 7, further comprising removing the oxide cap from over the SiP regions subsequent to the removing of the nitride capping layer.

9. The method according to claim 1,
wherein the removing of the nitride capping layer is performed using a hot phosphorus rinse, and
wherein the oxide cap protects the subset of the RSD structures from damage during the hot phosphorus rinse.

10. A method for forming an oxide cap to protect a fin-shaped field effect transistor (FinFET) device, the method comprising:
forming a set of gate structures over a finned substrate, each of the set of gate structures comprising a nitride capping layer;
forming a set of raised source drain (RSD) structures on the finned substrate;
forming a silicate over a subset of the RSD structures;
oxidizing the silicate to form the oxide cap; and
removing the nitride capping layer.

11. The method according to claim 10, further comprising:
forming a set of fins from the substrate to form the finned substrate; and
growing a RSD structure of the set on RSD structures on each fin of the set of fins.

12. The method according to claim 11, further comprising:
forming an NFET region from a subset of the set of fins; and
forming a PFET region from a remainder of the set of fins.

13. The method according to claim 12, further comprising:
forming a set of phosphorus-doped Si (SiP) regions of the RSD in the NFET region; and
forming a set of silicon germanium (SiGe) regions of the RSD in the PFET region.

14. The method according to claim 13, further comprising:
growing a silicate on the SiP regions; and
oxidizing the silicate using a plasma oxidation process, wherein the oxide cap is formed only over the SiP regions.

15. The method according to claim 14,
wherein the silicate is grown on the SiP regions using an epitaxial process; and
wherein the plasma oxidation process includes a thermal oxidation process.

16. The method according to claim 15, further comprising removing the oxide cap from over the SiP regions subsequent to the removing of the nitride capping layer.

17. The method according to claim 10,
wherein the removing of the nitride capping layer is performed using a hot phosphorus rinse, and
wherein the oxide cap protects the subset of the RSD structures from damage during the removing of the nitride capping layer.

* * * * *